(12) United States Patent
Lin et al.

(10) Patent No.: US 12,374,639 B2
(45) Date of Patent: Jul. 29, 2025

(54) NON-DMSO STRIPPER FOR ADVANCE PACKAGE METAL PLATING PROCESS

(71) Applicant: Taiwan Semiconductor Manufacturing Co., Ltd., Hsinchu (TW)

(72) Inventors: Tzu-Yang Lin, Hsinchu (TW); Chen-Yu Liu, Hsinchu (TW); Yung-Han Chuang, Hsinchu (TW); Ming-Da Cheng, Hsinchu (TW); Ching-Yu Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 584 days.

(21) Appl. No.: 17/827,415

(22) Filed: May 27, 2022

(65) Prior Publication Data

US 2023/0317647 A1    Oct. 5, 2023

Related U.S. Application Data

(60) Provisional application No. 63/327,221, filed on Apr. 4, 2022.

(51) Int. Cl.
| | | |
|---|---|---|
| *H01L 23/00* | (2006.01) | |
| *C11D 3/30* | (2006.01) | |
| *G03F 7/42* | (2006.01) | |

(52) U.S. Cl.
CPC .............. *H01L 24/03* (2013.01); *C11D 3/30* (2013.01); *G03F 7/425* (2013.01); *C11D 2111/22* (2024.01); *H01L 2224/0346* (2013.01); *H01L 2224/0362* (2013.01)

(58) Field of Classification Search
None
See application file for complete search history.

(56) References Cited

U.S. PATENT DOCUMENTS

| | | | |
|---|---|---|---|
| 7,718,591 B2 * | 5/2010 | Hsu | C11D 3/046 |
| | | | 134/2 |
| 8,389,455 B2 | 3/2013 | Queillen et al. | |
| 2008/0318413 A1 * | 12/2008 | Fillion | H01L 23/5389 |
| | | | 438/622 |
| 2009/0082240 A1 * | 3/2009 | Nukui | G03F 7/425 |
| | | | 510/176 |
| 2022/0276562 A1 * | 9/2022 | Wu | G03F 7/426 |
| 2022/0285172 A1 * | 9/2022 | Naito | H01L 24/11 |
| 2022/0304163 A1 * | 9/2022 | Hichri | H05K 3/4038 |

FOREIGN PATENT DOCUMENTS

| | | |
|---|---|---|
| CN | 110383179 B | 10/2021 |
| TW | 202113507 A | 4/2021 |

* cited by examiner

*Primary Examiner* — Binh X Tran
(74) *Attorney, Agent, or Firm* — Seed IP Law Group LLP

(57) ABSTRACT

A method for forming a semiconductor structure is provided. The method includes forming a patterned photoresist layer over a substrate and removing the patterned photoresist layer using a photoresist stripping composition that is free of dimethyl sulfoxide. The photoresist stripping composition includes an organic alkaline compound including at least one of a primary amine, secondary amine, a tertiary amine or a quaternary ammonium hydroxide or a salt thereof, an organic solvent selected from the group consisting of a glycol ether, a glycol acetate, a glycol, a pyrrolidone and mixtures thereof, and a polymer solubilizer.

20 Claims, 3 Drawing Sheets

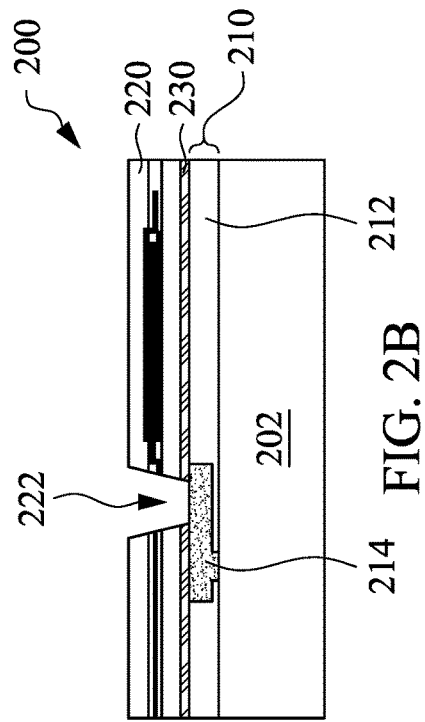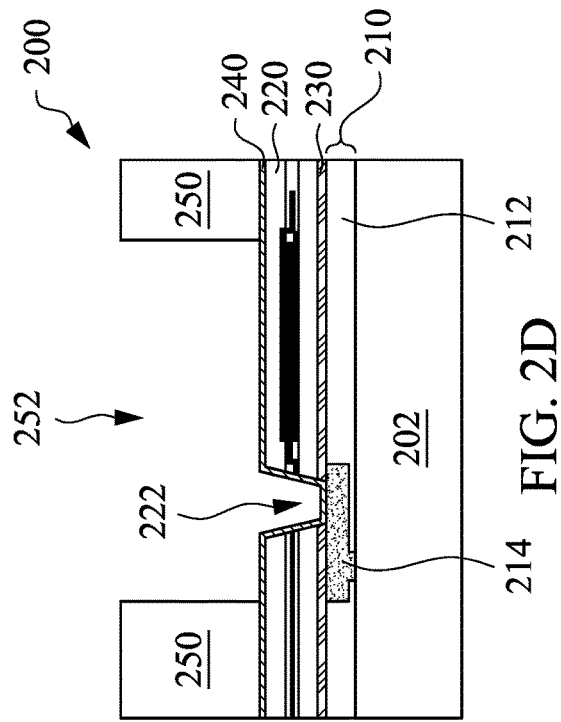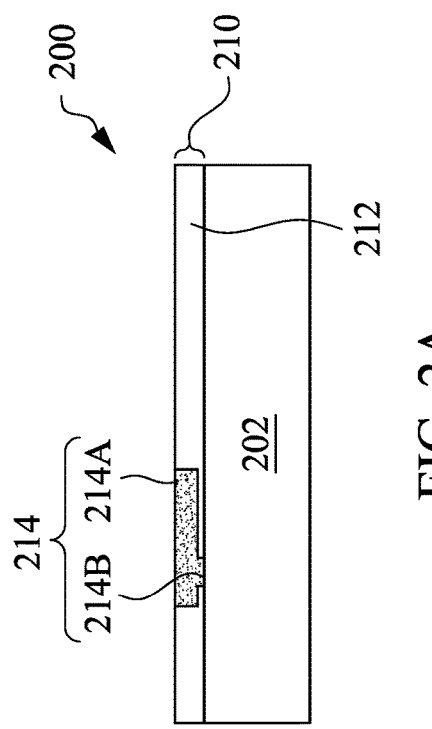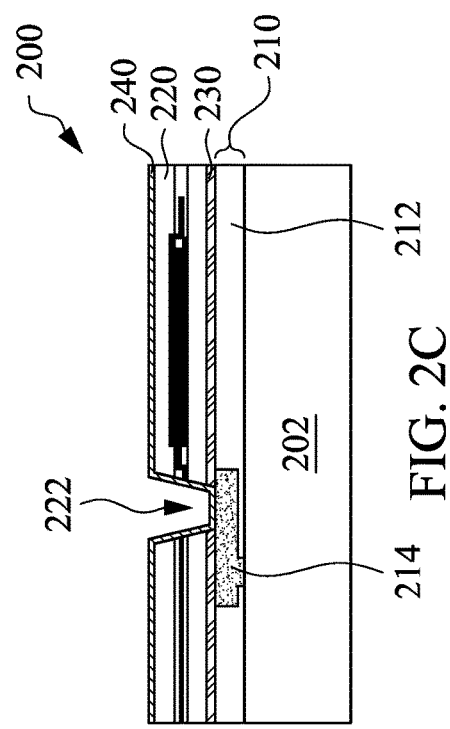

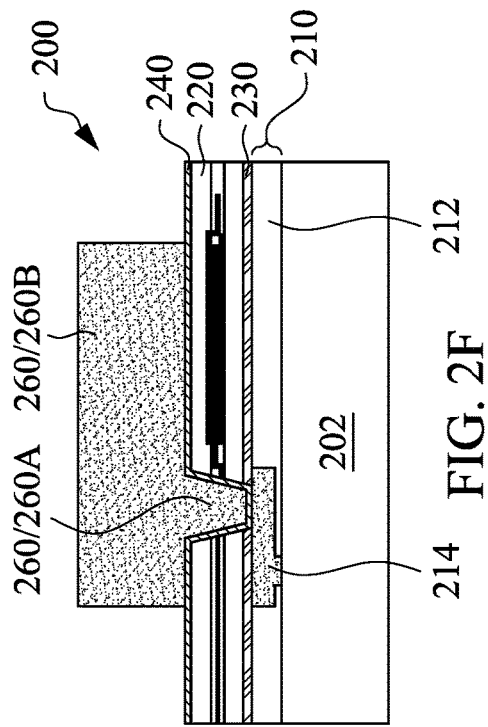
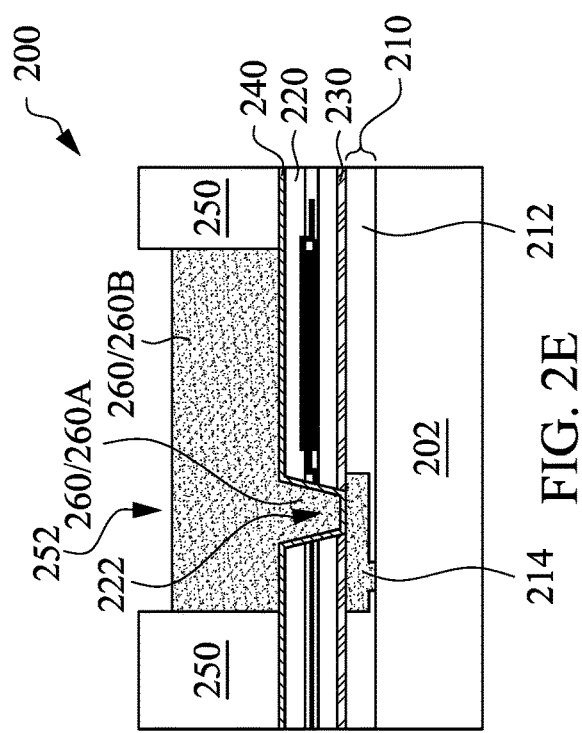
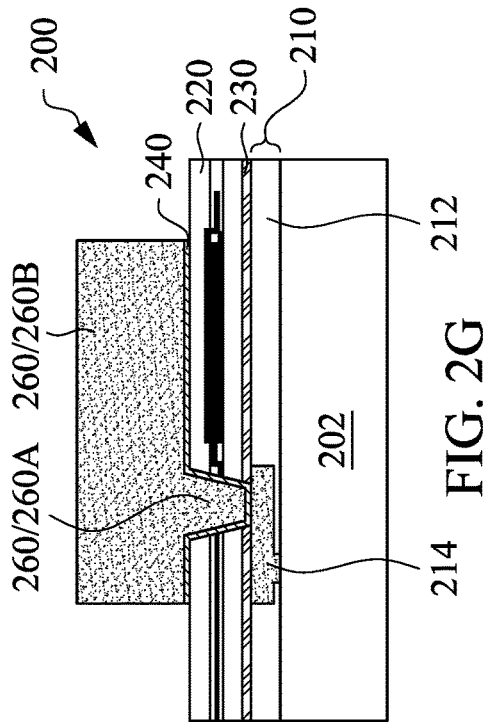
FIG. 2E
FIG. 2F
FIG. 2G

NON-DMSO STRIPPER FOR ADVANCE PACKAGE METAL PLATING PROCESS

PRIORITY CLAIM AND CROSS-REFERENCE

This application claims the benefit of U.S. Provisional Patent Application No. 63/327,221, filed Apr. 4, 2022, which is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2G are cross-sectional views of a semiconductor structure fabricated using the method of FIG. 1, in accordance with some embodiments.

DETAILED DESCRIPTION

Figure 1:
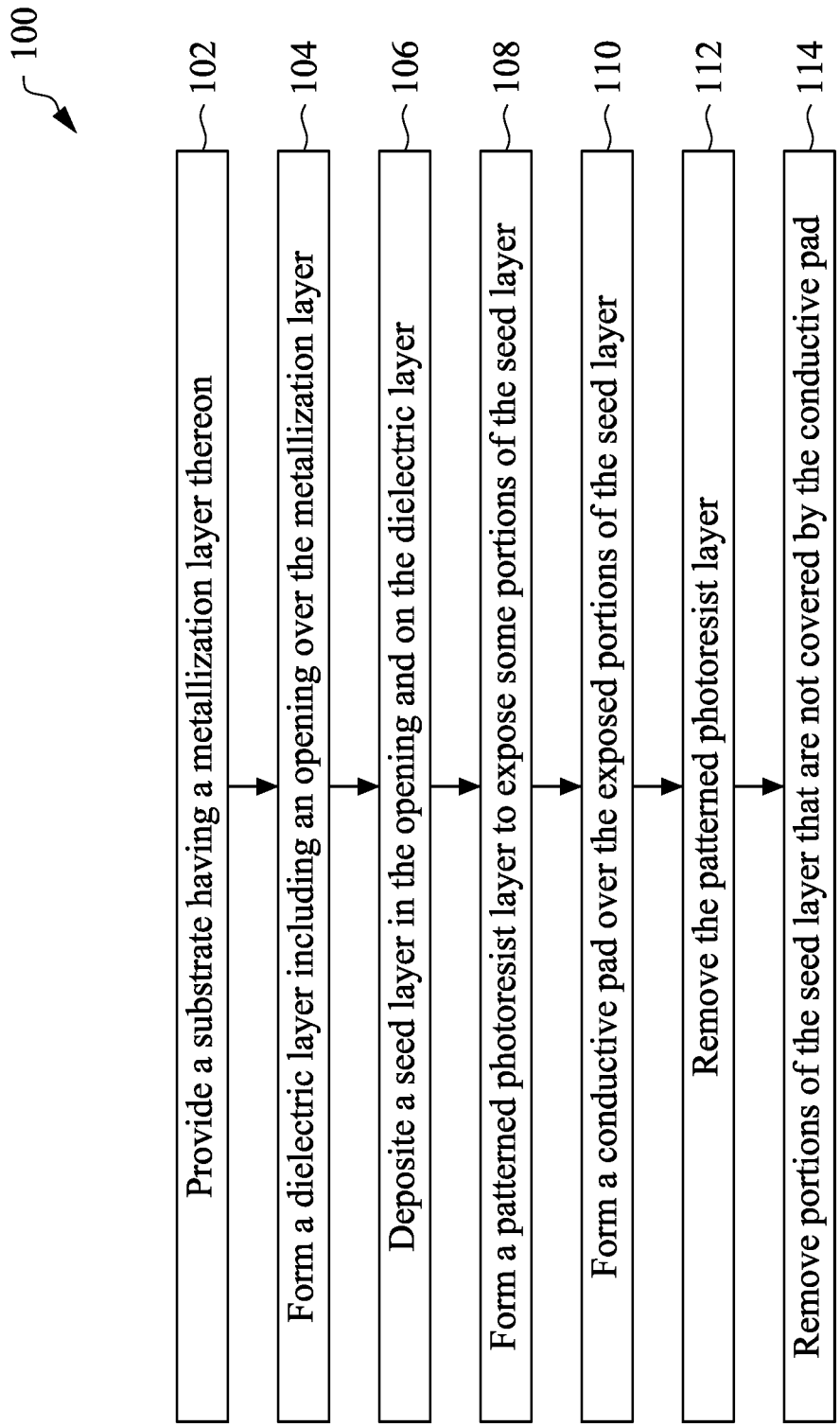
FIG. 1 is a flow chart of a method for fabricating a semiconductor structure, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The system may be otherwise oriented (rotated 90 degrees or at other orientations) and the spatially relative descriptors used herein may likewise be interpreted accordingly.

IC fabrication uses one or more photolithography processes to transfer geometric patterns to a film or substrate. Geometric shapes and patterns on/within a semiconductor substrate make up the complex structures that allow the dopants, electrical properties and wires to complete a circuit and fulfill a technological purpose. In a photolithography process, a photoresist is applied as a thin film to a substrate, and subsequently exposed through a photomask. The photomask contains clear and opaque features that define a pattern which is to be created in the photoresist layer. Areas in the photoresist exposed to light transmitted through the photomask are made either soluble or insoluble in a specific type of solution known as a developer. In the case when the exposed regions are soluble, a positive image of the photomask is produced in the photoresist and this type of photoresist is called a positive photoresist. On the other hand, if the unexposed areas are dissolved by the developer, a negative image results in the photoresist and this type of photoresist is called a negative photoresist. After developing, the areas no longer covered by photoresist are removed by etching, thereby replicating the mask pattern in the substrate.

Upon completion of the etching process, the remaining photoresist is no longer needed and must be removed from the substrate. A wet stripping process using a photoresist stripping solution may be performed to chemically alter the photoresist so that it no longer adheres to the substrate. Dimethylsulfoxide (DMSO) is the most common solvent used in photoresist stripping solutions. This solvent, however, can cause environmental damages. Growing environmental concerns on DMSO which may eventually lead to the ban of DMSO makes developing a DMSO-free photoresist stripper necessary.

The photoresist stripping compositions of the present disclosure use more environmental friendly solvents such as propylene glycol methyl ether (PGME), propylene glycol methyl ether acetate (PGMEA), diethylene glycol monobutyl ether, propylene glycol, diethylene glycol ethyl methyl ether, N-methyl-2-pyrrolidone (NMP), or N-ethyl-2-pyrrolidone, which causes no or less environmental damages than DMSO. The photoresist stripping compositions of the present disclosure do not contain DMSO and can effectively remove positive and negative photoresists without corroding the underlying substrate and metal wiring during device fabrication. As a result, the environmental damages caused by DMSO would not be a problem.

In some embodiments of the present disclosure, the photoresist stripping composition includes an organic alkaline compound and an organic solvent. The photoresist stripping composition does not contain DMSO.

The organic alkaline compound is capable of de-cross-linking the photoresist. In some embodiments, the organic alkaline compound includes at least one of a primary amine, a secondary amine, a tertiary amine, or a quaternary ammonium hydroxide or a salt thereof.

The primary amine may be an amino alcohol. Examples of suitable amino alcohols include, but are not limited to, aminoethanol, aminopropanol, aminoisopropanol, aminobutanol, aminopentanol, aminohexanol, 2-(2-aminoethoxy) ethanol, 2-(2-aminoethylamino)ethanol, and 1-amino-2-propanol.

Examples of secondary amines include, but are not limited to, diethanolamine, iminobispropylamine, 2-methylaminoethanol, and N-methylethanolamine.

Examples of tertiary amines include, but are not limited to, dimethylethanolamine and diethylethanolamine.

Examples of suitable quaternary ammonium hydroxides include, but are not limited to, tetramethylammonium hydroxide (TMAH), tetraethylammonium hydroxide (TEAH), tetrapropylammonium hydroxide, tetrabutylammonium hydroxide (TBAH), ethyltrimethylammonium hydroxide, diethyldimethylammonium hydroxide, methyltripropylammonium hydroxide, butyltrimethylammonium hydroxide, methyltributylammonium hydroxide, pentyltrimethylammonium hydroxide, (2-hydroxyethyl)trimethylammonium hydroxide (choline), (2-hydroxyethyl)triethylammonium hydroxide, (2-hydroxyethyl)triethyl-ammonium hydroxide, (3-hydroxypropyll)triethylammonium hydroxide, tris-2-hydroxyethylammonium hydroxide, tetraethanolammonium hydroxide, phenyltrimethylammonium hydroxide, and benzyltrimethylammonium hydroxide.

In some embodiments, the photoresist stripping composition includes aminoethanol, tetramethylammonium hydroxide (TMAH), tetrabutylammonium hydroxide (TBAH), or mixtures thereof.

The organic alkaline compound may be present in an amount no greater than about 20% by weight, for example, from 0.5% to 20% by weight, from 1% to 15% by weight, based on the total weight of the composition. In some embodiments, the organic alkaline compound is present in an amount of about 20%, about 15%, about 10%, about 5%, or about 1% by weight.

The organic solvent is capable of dissolving the de-crosslinked photoresist. In some embodiments, the organic solvent is a water miscible solvent selected from glycol ether, glycol acetate, glycol, and pyrrolidone. Examples of glycol ether which is suitable to be used in the present disclosure include, but are not limited to, ethylene glycol monomethyl ether, ethylene glycol monoethyl ether, ethylene glycol monobutyl ether, diethylene glycol monomethyl ether, diethylene glycol monoethyl ether, diethylene glycol monopropyl ether, diethylene glycol monobutyl ether, triethylene glycol monomethyl ether, 3-methoxy-3-methyl-1-butanol, dipropylene glycol monomethyl ether, and 2-(2-methoxyethoxy)ethanol. Examples of glycol include, but are not limited to, ethylene glycol, propylene glycol, diethylene glycol, dipropylene glycol, and triethylene glycol. Examples of pyrrolidone include, but are not limited to, N-methyl-2-pyrrolidone, 2-pyrrolidone, 1,5-dimethyl-2-pyrrolidone, 3,3-dimethyl-2-pyrrolidone, N-ethyl-2-pyrrolidone, N-ethoxy-2-pyrrolidone, N-ethylene-2-pyrrolidone, and 1-pyrrolidone. In some embodiments, the organic solvent includes one or more of propylene glycol methyl ether (PGME), propylene glycol methyl ether acetate (PGMEA), diethylene glycol monobutyl ether, propylene glycol, diethylene glycol ethyl methyl ether, N-methyl-2-pyrrolidone (NMP), and N-ethyl-2-pyrrolidone.

The organic solvent may be present in an amount of about 60% to about 90% by weight based on the total weight of the composition. In some embodiments, the organic solvent may be present in an amount of about 60% by weight, about 65% by weight, about 70% by weight, about 75% by weight, about 80% by weight, about 85% by weight, or about 90% by weight.

Optionally, the photoresist stripping composition of the present disclosure may include a co-solvent as a solubilizer to facilitate the dissolution of the de-crosslinked photoresist in the organic solvent. Examples of suitable co-solvents include, but are not limited to, polyhydroxystyrene, pyrrolidone, polystyrene, styrene-hydroxystyrene copolymer, polyvinyl acetate, polyvinyl butyral, and mixtures thereof. The co-solvent may be present in an amount of about 15% or less by weight, for example, about 12% or less by weight, about 10% or less by weight, about 8% or less by weight, or about 5% or less by weight, base on the total weight of the composition. In some embodiments, the photoresist stripping composition does not contain any co-solvent.

Optionally, the photoresist stripping composition of the present disclosure may include a surfactant for preventing redeposition of photoresist and corrosion of metal wiring. The surfactants that can be used in the present disclosure includes nonionic surfactants, cationic surfactants, anionic surfactants, and ampholytic surfactants. In some embodiments, the surfactant may include polyoxyethylene alkyl ether, polyoxyethylene alkyl aryl ether, sorbitan fatty acid ester, polyoxyethylene sorbitan fatty acid ester, fatty acid monoglyceride, benzotriazole, or ethylene oxide/propylene oxide copolymer. Examples of commercial nonionic surfactants include, but are not limited to, dynol 607®, dynol 800®, surfynol 420®, surfynol 440®, surfynol 465®, surfynol 485®, pluronic P123®, and mixtures thereof. The surfactant may be present in an amount of 0~5% by weight based on the total weight of the composition. In some embodiments, the surfactant may be present in an amount of about 5% by weight, about 4% by weight, about 3% by weight, about 2% by weight, or about 1% by weight. In some embodiments, the photoresist stripping composition does not contain any surfactant.

Optionally, the photoresist stripping composition of the present disclosure may include water. The water may be present in an amount of about 20% or less by weight based on the total weight of the composition. In some embodiments, the water is present in an amount of about 20% by weight, about 15% by weight, about 10% by weight, about 8% by weight, or about 5% by weight. In some embodiments, the photoresist stripping composition does not contain any water.

The photoresist stripping composition of the present disclosure has the advantages of achieving a good resist removing effect, causing no damages to the substrate and metal wiring, having low toxicity, and resulting in little or no environmental contamination comparing to the photoresist stripping composition using DMSO as the solvent.

FIG. 1 is a flowchart illustrating a method 100 for fabricating a semiconductor structure, in accordance with some embodiments of the present disclosure. FIG. 2A through 2G are cross-sectional views of a semiconductor structure 200 at various fabrication stages, in accordance with some embodiments. The method 100 is described below in conjunction with FIG. 1 and FIGS. 2A through 2G wherein the semiconductor structure 200 is fabricated by using embodiments of the method 100. It is understood that additional steps can be provided before, during, and after the method 100, and some of the steps described below can be replaced or eliminated, for additional embodiments of the method. It is further understood that additional features can be added in the semiconductor structure 200, and some of the features described below can be replaced or eliminated, for additional embodiments of the semiconductor structure 200.

The semiconductor structure 200 may be an intermediate structure during the fabrication of an IC, or a portion thereof. The IC may include logic circuits, memory structures, passive components (such as resistors, capacitors, and inductors), and active components such as diodes, field-effect transistors (FETs), metal-oxide semiconductor field effect transistors (MOSFETs), complementary metal-oxide semiconductor (CMOS) transistors, bipolar transistors, high voltage transistors, high frequency transistors, fin-like FETs (FinFETs), other three-dimensional (3D) FETs, and combinations thereof. The semiconductor structure 200 may include a plurality of semiconductor devices (e.g., transistors), which may be interconnected.

Referring to FIGS. 1 and 2A, the method 100 includes operation 102, in which a substrate 202 having a metallization layer 210 formed thereon is provided, in accordance with some embodiments. FIG. 2A is a cross-sectional view of the semiconductor structure 200 including the substrate 202 and the metallization layer 210, in accordance with some embodiments.

In some embodiments, the substrate 202 may be a bulk semiconductor substrate including one or more semiconductor materials. In some embodiments, the substrate 202 may include silicon, silicon germanium, carbon doped silicon (Si:C), silicon germanium carbide, or other suitable semiconductor materials. In some embodiments, the substrate 202 is composed entirely of silicon.

In some embodiments, the substrate 202 may include one or more epitaxial layers formed on a top surface of a bulk semiconductor substrate. In some embodiments, the one or more epitaxial layers introduce strains in the substrate 202 for performance enhancement. For example, the epitaxial layer includes a semiconductor material different from that of the bulk semiconductor substrate, such as a layer of silicon germanium overlying bulk silicon or a layer of silicon overlying bulk silicon germanium. In some embodiments, the epitaxial layer(s) incorporated in the substrate 202 are formed by selective epitaxial growth, such as, for example, metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), or combinations thereof.

In some embodiments, the substrate 202 may be a semiconductor-on-insulator (SOI) substrate. In some embodiments, the SOI substrate includes a semiconductor layer, such as a silicon layer formed on an insulator layer. In some embodiments, the insulator layer is a buried oxide (BOX) layer including silicon oxide or silicon germanium oxide. The insulator layer is provided on a handle substrate such as, for example, a silicon substrate. In some embodiments, the SOI substrate is formed using separation by implanted oxygen (SIMOX) or other suitable technique, such as wafer bonding and grinding.

In some embodiments, the substrate 202 may also include a dielectric substrate such as silicon oxide, silicon nitride, silicon oxynitride, a low-k dielectric, silicon carbide, and/or other suitable layers.

In some embodiments, the substrate 202 may also include various p-type doped regions and/or n-type doped regions, implemented by a process such as ion implantation and/or diffusion. Those doped regions include n-well, p-well, lightly doped region (LDD) and various IC channel doping profiles configured to form various IC devices, such as a CMOS transistor, imaging sensor, and/or light emitting diode (LED). The substrate 202 may further include other functional features such as a resistor and/or a capacitor formed in and/or on the substrate 202.

In some embodiments, the substrate 202 may also include various isolation features. The isolation features separate various device regions in the substrate 202. The isolation features include different structures formed by using different processing technologies. For example, the isolation features may include shallow trench isolation (STI) features. The formation of an STI may include etching a trench in the substrate 202 and filling in the trench with insulator materials such as silicon oxide, silicon nitride, and/or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

In some embodiments, the substrate 202 may also include gate stacks formed by dielectric layers and electrode layers. The dielectric layers may include an interfacial layer and a high-k dielectric layer deposited by suitable techniques, such as chemical vapor deposition (CVD), atomic layer deposition (ALD), physical vapor deposition (PVD), thermal oxidation, combinations thereof, and/or other suitable techniques. The interfacial layer may include silicon dioxide and the high-k dielectric layer may include LaO, AlO, ZrO, TiO, $Ta_2O_5$, $Y_2O_3$, $SrTiO_3$, $BaTiO_3$, BaZrO, HfZrO, HfLaO, HfSiO, LaSiO, AlSiO, HfTaO, HfTiO, $(Ba,Sr)TiO_3$ (BST), $Al_2O_3$, $Si_3N_4$, SiON, and/or other suitable materials. The electrode layer may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The electrode layer may include Ti, Ag, Al, TiAlN, TaC, TaCN, TaSiN, Mn, Zr, TiN, TaN, Ru, Mo, Al, WN, Cu, W, any suitable materials, and/or a combination thereof.

In some embodiments, the substrate 202 may also include a plurality of inter-level dielectric (ILD) layers and conductive features integrated to form an interconnect structure configured to couple the various p-type and n-type doped regions and the other functional features (such as gate electrodes), resulting in a functional integrated circuit. In FIG. 2A, a topmost metallization layer, e.g., metallization layer 210, is illustrated and described.

In some embodiments, the metallization layer 210 includes a dielectric layer 212 and at least one interconnect structure 214 embedded therein. In some embodiments, the interconnect structure 214 includes a conductive line 214A and a conductive via 214B. The conductive line 214A provides horizontal electrical routing, while the conductive via 214B provides vertical connection between conductive lines in different metallization layers. The metallization layer 210 may be formed through any suitable process such as deposition, damascene, dual damascene, etc. Although a single interconnect structure is illustrated, any number of interconnect structures is contemplated.

Referring to FIGS. 1 and 2B, the method 100 proceeds to operation 104, in which a dielectric layer 220 including an opening 222 is formed over the substrate 202, in accordance with some embodiments. FIG. 2B is a cross-sectional view of the semiconductor structure 200 after forming the dielectric layer 220 over the substrate 202, in accordance with some embodiments.

In some embodiments and as shown in FIG. 2B, the dielectric layer 220 is formed on the dielectric layer 212 and the interconnect structure 214. In some embodiments, the dielectric layer 220 may be formed of an organic material, which may be a polymer such as polybenzoxazole (PBO), polyimide, benzocyclobutene (BCB), or the like. In some other embodiments, the dielectric layer 220 may be formed of an inorganic material such as silicon nitride, silicon oxide, or the like. In some embodiments, the dielectric layer 220 may include a low-k dielectric material having a dielectric constant (k) less than 4. In some embodiments, the low-k dielectric material has a dielectric constant from about 1.2 to about 3.5. In some embodiments, the dielectric layer 220 includes silicon oxide obtained from tetraethylorthosilicate (TEOS) oxide, undoped silicate glass, doped silicate glass such as borophosphosilicate glass (BPSG), fused silica glass (FSG), phosphosilicate glass (PSG), or boron doped silicon glass (BSG). The dielectric layer 220 may be formed by any suitable deposition processes, such as spin coating, CVD, PVD, or plasma enhanced chemical vapor deposition (PECVD). In some embodiments, after deposition, the dielectric layer 220 may be planarized by a planarization process or otherwise recessed to provide a planar top surface. In some embodiments, the dielectric layer 220 is planarized using a CMP process.

The dielectric layer 220 is subsequently etched to form an opening 222 therein. The opening 222 expends through the dielectric layer 220, exposing a surface of the interconnect structure 214. Although a single opening 222 is illustrated and descripted, any number of openings is contemplated.

The dielectric layer 220 may be etched using lithography and etching processes. In some embodiments, the lithography process includes applying a photoresist layer (not shown) over the dielectric layer 220, exposing the photoresist layer to a pattern, performing post-exposure baking, and developing the photoresist to form a patterned photoresist layer (not shown). The patterned photoresist layer exposes a portion of the dielectric layer 220 where the opening 222 is to be formed. Next, the portion of the dielectric layer 220 exposed by the patterned photoresist layer is etched to form the opening 222. In some embodiments, the dielectric layer 220 is etched using a dry etch such as, for example, a reactive ion etch (RIE) or a plasma etch. In some embodiments, the dielectric layer 220 is etched using a wet etch. After formation of the opening 222 in the dielectric layer 220, the patterned photoresist layer is removed, for example, by wet stripping using the photoresist stripping composition of the present disclosure or by plasma ashing. Alternatively, in some embodiments, a hard mask is used such that the opening pattern is transferred from the patterned photoresist layer to the hard mask by a first etch and then transferred to the dielectric layer 220 by a second etch.

In some embodiments, prior to deposition of the dielectric layer 220, a dielectric cap layer 230 may be formed over the dielectric layer 212 and the interconnect structure 214. The dielectric cap layer 230 can protect underlying metallization layer 210 from impurities that may diffuse down from upper levels, and can function as a diffusion barrier layer that prevents vertical diffusion of metallic impurities, moisture, or other gaseous impurities. The dielectric cap layer 230 may include, for example, silicon nitride, silicon oxynitride, silicon carbide, nitrogen and hydrogen doped silicon carbide (SiCNH), or a combination thereof. The dielectric cap layer 230 may be formed, for example, by CVD or ALD. The dielectric cap layer 230 is optional, and is omitted in some embodiments. If present, the opening 222 also extends through the dielectric cap layer 230 to expose the interconnect structure 214.

Referring to FIGS. 1 and 2C, the method 100 proceeds to operation 106, in which a seed layer 240 is formed, in accordance with some embodiments. FIG. 2C is a cross-sectional view of the semiconductor structure 200 after forming the seed layer 240, in accordance with some embodiments.

The seed layer 240 is a thin layer of a conductive material that aids in the formation of conductive pads during subsequent processing steps. As shown in FIG. 2C, the seed layer 240 is formed to include portions extending into the opening 222 and portions over the dielectric layer 220. The seed layer 240 may be a single layer or a composite layer comprising a plurality of sub-layers formed of different conductive materials. In some embodiments, the seed layer 240 may include a titanium layer and a copper layer over the titanium layer. Alternatively, the seed layer 240 includes a copper layer with no titanium layer. The seed layer 240 may be formed, for example, using CVD, PECVD, PVD, or ALD.

Referring to FIGS. 1 and 2D, the method 100 proceeds to operation 108, in which a patterned photoresist layer 250 is formed over the seed layer 240, in accordance with some embodiments. FIG. 2D is a cross-sectional view of the semiconductor structure 200 after forming the patterned photoresist layer 250 over the seed layer 240, in accordance with some embodiments.

The patterned photoresist layer 250 includes an opening 252 that exposes portions of the seed layer 240 in the opening 222 and portions of the seed layer 240 over the dielectric layer 220 around the opening 222. The patterned photoresist layer 250 is formed by first applying a photoresist layer on the seed layer 240 by, for example, spin coating. The photoresist may be a positive or negative resist sensitive to a radiation, such as a DUV light (e.g., 248 nm radiation by krypton fluoride (KrF) excimer laser or 193 nm radiation by argon fluoride (ArF) excimer laser or an EUV light (e.g., 13.5 nm light). In some embodiments, the photoresist is a crosslinkable negative photoresist. The photoresist layer may be formed to have a thickness of at least 4 µm. If the photoresist layer is too thin, the risk of photoresist pattern collapse during the lithography patterning process increases.

In some embodiments, the photoresist layer is further treated with a soft baking process to drive off the solvent. In some embodiments, the soft bake process is performed at a temperature suitable to evaporate the solvent in the photoresist layer, such as between about 100° C. and 200° C., although the precise temperature depends upon the materials chosen for the photoresist layer. For example, in some embodiments, the photoresist layer is heated to about 150° C. The soft bake process is performed for a time sufficient to cure and dry the photoresist layer. In some embodiments, the soft bake process is performed for a time period from about 10 seconds to about 10 minutes. For example, in some embodiments, the photoresist layer is cured for about 300 seconds.

The photoresist layer is then exposed to a patterning radiation from a light source through a photomask. The pattern of the photomask corresponds to the conductive pads subsequently formed. In some embodiments, the patterning radiation is an EUV radiation (e.g., 13.5 nm). Alternatively, in some embodiments, the patterning radiation is a DUV radiation (e.g., from a 248 nm KrF excimer laser or a 193 nm ArF excimer laser). In some embodiments, the patterning exposure is performed in a liquid (immersion lithography) or in a vacuum for EUV lithography.

Subsequently, the photoresist layer may be subjected to a post-exposure bake process. The post-exposure bake process may be performed at a temperature from about 50° C. to about 150° C. for a duration from about 60 seconds to about 360 seconds.

Next, the photoresist layer is developed using a developer to form the patterned photoresist layer 250. The developer may remove the exposed or unexposed portions of the photoresist layer depending on the resist type. In instances where the photoresist layer includes a negative tone resist, the portions of the photoresist layer that are exposed by the patterning radiation are not dissolved by the developer and remain in the semiconductor structure 200. On the other hand, if the photoresist layer includes a positive tone resist, the portions of the photoresist layer that are exposed by the patterning radiation would be dissolved by the developer, leaving the unexposed portions in the semiconductor structure 200.

The developer may include alcohols, aromatic hydrocarbons, and the like. Examples of alcohols include, but are not limited to, methanol, ethanol, 1-butanol, and 4-Methyl-2-pentanol. Examples of aromatic hydrocarbons include, but are not limited to, xylene, toluene and benzene. In some embodiments, the developer is selected from at least one of methanol, 4-methyl-2-pentanol and xylene.

The developer may be applied using any suitable methods. In some embodiments, the developer is applied by dipping the structure into a developer bath. In some embodiments, the developing solution is sprayed onto the photoresist layer.

Referring to FIGS. 1 and 2E, the method 100 proceeds to operation 110, in which a conductive pad 260 is formed on the exposed portions of the seed layer 240 not covered by the patterned photoresist layer 250, in accordance with some embodiments. FIG. 2E is a cross-sectional view of the semiconductor structure 200 after forming the conductive pad 260, in accordance with some embodiments.

The conductive pad 260 is formed to include a conductive via 260A in the opening 222 and a conductive line 260B in the opening 252. The conductive pad 260 thus provides electrical connection to the interconnect structure 214. In some embodiments, the conductive pad 260 is used to couple to an overlying conductive connection (not shown) and may be referred to as under bump metallurgy (UMB). In some embodiments, the conductive pad 260 is formed such that the conductive line 260B has a thickness from about 1 μm to about 10 μm, and a width from about 0.5 μm to about 20 μm. The spacing between the conductive pad 260 and an adjacent conductive pad (not shown) is less than 20 μm.

The conductive pad 260 may be formed by a plating process, where a conductive material such as copper, tungsten, or cobalt is plated on the exposed portions of the seed layer 240. The portions of the seed layer 240 overlapped by the plated material are also considered as part of the conductive pad 260. The plating process is continued until a top surface of the plated conductive material is above the topmost surface of the seed layer 240, but below the top surface of the patterned photoresist layer 250.

Referring to FIGS. 1 and 2F, the method 100 proceeds to operation 112, in which the patterned photoresist layer 250 is removed, in accordance with some embodiments. FIG. 2F is a cross-sectional view of the semiconductor structure 200 after removing the patterned photoresist layer 250, in accordance with some embodiments.

After the plating of the conductive material, the patterned photoresist layer 250 is removed, revealing the underlying portions of the seed layer 240. In some embodiments, the patterned photoresist layer 250 is removed by wet stripping using the photoresist stripping composition of the present disclosure. The photoresist stripping composition of the present disclosure allows removing the patterned photoresist layer 250 from the structure without damaging the conductive pad 260 and the underlying components in the substrate 202. For example, it has found that the corrosion rate of the photoresist stripping composition of the present disclosure to copper is less than 1 Å/min.

Referring to FIGS. 1 and 2G, the method 100 proceeds to operation 114, in which the portions of the seed layer 240 that are not covered by the conductive pad 260 are removed, in accordance with some embodiments. FIG. 2G is a cross-sectional view of the semiconductor structure 200 after removing the portions of the seed layer 240 that are not covered by the conductive pad 260, in accordance with some embodiments.

An etching process may be performed to remove portions of the seed layer 240 that are not covered by the conductive pad 260. In some embodiments, the etching process employed is an anisotropic etch such as a dry etch or a wet etch. In some embodiments, the dry etch is a reactive ion etch (RIE) or a plasma etch.

Subsequently, a conductive connector (not shown) may then be formed on the conductive pad 260. The conductive connector may be a BGA connector, a solder ball, a metal pillar, a controlled collapse chip connection (C4) bump, a micro bump, an electroless nickel-electroless palladium-immersion gold technique (ENEPIG) formed bump, or the like. The conductive connector may include a conductive material such as solder, copper, aluminum, gold, nickel, silver, palladium, tin, the like, or a combination thereof.

One aspect of this description relates to a method for forming a semiconductor structure. The method includes forming a patterned photoresist layer over a substrate and removing the patterned photoresist layer using a photoresist stripping composition that is free of dimethyl sulfoxide. The photoresist stripping composition includes an organic alkaline compound including at least one of a primary amine, secondary amine, a tertiary amine or a quaternary ammonium hydroxide or a salt thereof; an organic solvent selected from the group consisting of a glycol ether, a glycol acetate, a glycol, a pyrrolidone and mixtures thereof; and a polymer solubilizer.

Another aspect of this description relates to a method for forming a semiconductor structure. The method includes forming a dielectric layer over a substrate; etching the dielectric layer to form an opening therein; depositing a seed layer along exposed surfaces of the opening and on a top surface of the dielectric layer; forming a patterned photoresist layer on the seed layer, the patterned photoresist layer exposing portions of the seed layer in the opening and portions of the seed layer over the top surface of the dielectric layer around the opening; performing a plating process to deposit a conductive pad over the exposed portions of the seed layer; and removing the patterned photoresist layer using a photoresist stripping composition. The photoresist stripping composition includes an organic alkaline compound comprising at least one of a primary amine, a secondary amine, a tertiary amine or a quaternary amine hydroxide or a salt thereof; a solvent comprising at least one of a glycol ether, a glycol acetate, a glycol or a pyrrolidone; a co-solvent comprising at least one of polyhydroxystyrene, styrene-hydroxystyrene copolymer, polyvinyl acetate or polyvinyl butyral; and a surfactant. The photoresist stripping composition is free of dimethyl sulfoxide.

Still another aspect of this description relates to a photoresist stripping composition. The photoresist stripping composition includes an organic alkaline compound comprising a primary amine, a secondary amine, a tertiary amine, a quaternary amine hydroxide or a salt thereof or mixtures thereof; a solvent comprising a glycol ether, a glycol acetate, a glycol, a pyrrolidone or mixtures thereof; and a co-solvent comprising polyhydroxystyrene, styrene-hydroxystyrene copolymer, polyvinyl acetate, polyvinyl butyral or mixtures thereof. The photoresist stripping composition is free of dimethyl sulfoxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a dielectric layer over a substrate;
   etching the dielectric layer to form an opening therein;
   depositing a seed layer along exposed surfaces of the opening and on a top surface of the dielectric layer;
   forming a patterned photoresist layer on the seed layer, the patterned photoresist layer exposing portions of the seed layer in the opening and portions of the seed layer over the top surface of the dielectric layer around the opening;
   performing a plating process to deposit a conductive pad over the exposed portions of the seed layer; and
   removing the patterned photoresist layer using a photoresist stripping composition, the photoresist stripping composition comprising:
      an organic alkaline compound comprising at least one of a primary amine, a secondary amine, a tertiary amine or a quaternary amine hydroxide or a salt thereof;
      a solvent comprising at least one of a glycol ether, a glycol acetate, a glycol or a pyrrolidone;
      a co-solvent comprising at least one of polyhydroxystyrene, styrene-hydroxystyrene copolymer, polyvinyl acetate or polyvinyl butyral; and
      a surfactant,
      wherein the photoresist stripping composition is free of dimethyl sulfoxide.

2. The method of claim 1, wherein the organic alkaline compound comprises at least one of aminoethanol, tetramethylammonium hydroxide or tetrabutylammonium hydroxide.

3. The method of claim 1, wherein the solvent comprises at least one of propylene glycol methyl ether, propylene glycol methyl ether acetate, diethylene glycol monobutyl ether, propylene glycol, diethylene glycol ethyl methyl ether, N-methyl-2-pyrrolidone or N-ethyl-2-pyrrolidone.

4. The method of claim 1, wherein the co-solvent comprises polyhydroxystyrene or styrene-hydroxystyrene copolymer.

5. The method of claim 1, wherein the surfactant comprises polyoxyethylene alkyl ether, polyoxyethylene alkyl aryl ether, sorbitan fatty acid ester, polyoxyethylene sorbitan fatty acid ester, fatty acid monoglyceride, benzotriazole or ethylene oxide-propylene oxide copolymer.

6. The method of claim 1, further comprising removing portions of the seed layer that are not covered by the conductive pad.

7. A method for forming a semiconductor structure, comprising:
   forming a dielectric layer over a substrate including a contact structure embedded therein;
   etching the dielectric layer to form a first opening exposing the contact structure;
   depositing a seed layer lining the first opening and above a top surface of the dielectric layer;
   forming a photoresist layer over the seed layer to fill the first opening;
   patterning the photoresist layer to form a patterned photoresist layer comprising a second opening therein, the second opening exposing portions of the seed layer in the first opening and on the dielectric layer around the first opening;
   forming an interconnect structure over the seed layer, wherein the interconnect structure fills the first and second openings and is laterally surrounded by the patterned photoresist layer;
   applying a photoresist stripping composition to the patterned photoresist layer to remove the patterned photoresist layer; and
   removing portions of the seed layer not covered by the interconnect structure,
   wherein the photoresist stripping composition comprises:
      an organic alkaline compound comprising a primary amine, a secondary amine, a tertiary amine, a quaternary amine hydroxide or a salt thereof or mixtures thereof;
      a solvent comprising a glycol ether, a glycol acetate, a glycol, a pyrrolidone or mixtures thereof; and
      a co-solvent comprising polyhydroxystyrene, styrene-hydroxystyrene copolymer, polyvinyl acetate, polyvinyl butyral or mixtures thereof,
      wherein the photoresist stripping composition is free of dimethyl sulfoxide.

8. The method of claim 7, wherein the solvent comprises propylene glycol methyl ether, propylene glycol methyl ether acetate, diethylene glycol monobutyl ether, propylene glycol, diethylene glycol ethyl methyl ether, N-methyl-2-pyrrolidone, N-ethyl-2-pyrrolidone or mixtures thereof.

9. The method of claim 7, further comprising a surfactant.

10. The method of claim 7, further comprising water.

11. A method for forming a semiconductor structure, comprising:
    forming a dielectric layer including a first opening over a substrate;
    deposing a seed layer along sidewall and bottom surfaces of the first opening and over the dielectric layer;
    forming a patterned photoresist layer over the seed layer, the patterned photoresist layer including a second opening overlying the first opening, the second opening having a lateral dimension greater than a lateral dimension of the first opening;
    forming a conductive feature in the first opening and the second opening; and
    removing the patterned photoresist layer using a photoresist stripping composition that is free of dimethyl sulfoxide, the photoresist stripping composition comprising:
       an organic alkaline compound including at least one of a primary amine, secondary amine, a tertiary amine or a quaternary ammonium hydroxide or a salt thereof;

an organic solvent selected from the group consisting of a glycol ether, a glycol acetate, a glycol, a pyrrolidone and mixtures thereof; and
a polymer solubilizer.

12. The method of claim 11, wherein the organic alkaline compound comprises aminoethanol, tetramethylammonium hydroxide, tetrabutylammonium hydroxide or mixtures thereof.

13. The method of claim 11, wherein the organic alkaline compound is present in an amount of no greater than about 20% by weight based on a total weight of the photoresist stripping composition.

14. The method of claim 11, wherein the organic solvent comprises propylene glycol methyl ether, propylene glycol methyl ether acetate, diethylene glycol monobutyl ether, propylene glycol, diethylene glycol ethyl methyl ether, N-methyl-2-pyrrolidone, N-ethyl-2-pyrrolidone or mixtures thereof.

15. The method of claim 11, wherein the organic solvent is present in an amount ranging from about 60% to about 90% by weight based on a total weight of the photoresist stripping composition.

16. The method of claim 11, wherein the polymer solubilizer comprises polyhydroxystyrene, styrene-hydroxystyrene copolymer, polyvinyl acetate, polyvinyl butyral or mixtures thereof.

17. The method of claim 11, wherein the polymer solubilizer is present in an amount of no greater than about 15% by weight based on a total weight of the photoresist stripping composition.

18. The method of claim 11, wherein the photoresist stripping composition further comprises water in an amount of no greater than about 20% by weight based on a total weight of the photoresist stripping composition.

19. The method of claim 11, wherein the photoresist stripping composition further comprises a surfactant in an amount of no greater than about 5% by weight based on a total weight of the photoresist stripping composition.

20. The method of claim 19, wherein the surfactant is a nonionic surfactant.

* * * * *